United States Patent
Noda

(10) Patent No.: US 9,918,381 B2
(45) Date of Patent: Mar. 13, 2018

(54) COMPONENT-EMBEDDED SUBSTRATE

(71) Applicant: Murata Manufacturing Co., Ltd., Kyoto (JP)

(72) Inventor: Satoru Noda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 151 days.

(21) Appl. No.: 14/588,614

(22) Filed: Jan. 2, 2015

(65) Prior Publication Data

US 2015/0116964 A1   Apr. 30, 2015

Related U.S. Application Data

(63) Continuation of application No. PCT/JP2013/067597, filed on Jun. 27, 2013.

(30) Foreign Application Priority Data

Jul. 5, 2012 (JP) ................ 2012-151173

(51) Int. Cl.
*H05K 1/18* (2006.01)
*H05K 1/02* (2006.01)
(Continued)

(52) U.S. Cl.
CPC ..... *H05K 1/0271* (2013.01); *H01L 23/49822* (2013.01); *H01L 23/50* (2013.01);
(Continued)

(58) Field of Classification Search
CPC ........... H01L 2224/16; H01L 23/49822; H01L 23/50; H05K 1/0271; H05K 1/036;H05K 1/0373; H05K 1/186; H05K 2201/0195; H05K 2201/0209; H05K 2201/0269;
(Continued)

(56) References Cited

U.S. PATENT DOCUMENTS

| 5,241,456 A | * | 8/1993 | Marcinkiewicz ... H01L 23/5384 |
| | | | 174/250 |
| 9,030,029 B2 | * | 5/2015 | Lin .................. H01L 23/36 |
| | | | 257/516 |

(Continued)

FOREIGN PATENT DOCUMENTS

| CN | 1418048 A | 5/2003 |
| CN | 102543900 A | 7/2012 |

(Continued)

OTHER PUBLICATIONS

International Search Report issued in Application No. PCT/JP2013/067597 dated Aug. 13, 2013.

(Continued)

*Primary Examiner* — Yuriy Semenenko
(74) *Attorney, Agent, or Firm* — Pearne & Gordon LLP

(57) ABSTRACT

A component-embedded substrate includes a substrate portion, an embedded electronic component, and a resin portion. The substrate portion has inner electrodes on an inner principal surface. The embedded electronic component has terminal electrodes and is mounted to the substrate portion via solder fillets adhering to the respective terminal electrodes and the respective inner electrodes. The resin portion is stacked on the substrate portion, with the embedded electronic component embedded therein. The resin portion includes a no-filler-added layer and a filler-added layer. The no-filler-added layer extends from the inner principal surface to a height which allows at least the solder fillets to be covered. The filler-added layer contains an inorganic filler and extends from an interface with the no-filler-added layer to a height which allows at least the embedded electronic component to be covered.

6 Claims, 5 Drawing Sheets

(51) Int. Cl.
*H01L 23/498* (2006.01)
*H01L 23/50* (2006.01)
*H05K 3/28* (2006.01)
*H05K 3/46* (2006.01)
*H05K 1/03* (2006.01)
*H05K 3/34* (2006.01)
*H05K 3/40* (2006.01)

(52) U.S. Cl.
CPC ............. *H05K 1/186* (2013.01); *H05K 3/284* (2013.01); *H05K 3/4602* (2013.01); *H05K 3/4673* (2013.01); *H01L 2224/16* (2013.01); *H05K 1/036* (2013.01); *H05K 1/0373* (2013.01); *H05K 3/3442* (2013.01); *H05K 3/4069* (2013.01); *H05K 3/4623* (2013.01); *H05K 3/4626* (2013.01); *H05K 3/4652* (2013.01); *H05K 2201/0195* (2013.01); *H05K 2201/0209* (2013.01); *H05K 2201/0269* (2013.01); *H05K 2201/0347* (2013.01); *H05K 2201/09136* (2013.01); *H05K 2201/10636* (2013.01); *H05K 2203/0126* (2013.01); *H05K 2203/0465* (2013.01); *H05K 2203/085* (2013.01); *H05K 2203/1316* (2013.01); *H05K 2203/1322* (2013.01); *Y02P 70/611* (2015.11)

(58) Field of Classification Search
CPC . H05K 2201/0347; H05K 2201/09136; H05K 2201/10636
See application file for complete search history.

(56) References Cited

U.S. PATENT DOCUMENTS

| | | | | |
|---|---|---|---|---|
| 2003/0090883 | A1* | 5/2003 | Asahi | H01L 21/6835 361/761 |
| 2007/0081312 | A1* | 4/2007 | Noda | H01L 23/49822 361/760 |
| 2012/0161339 | A1* | 6/2012 | Sekiguchi | H01L 21/561 257/791 |

FOREIGN PATENT DOCUMENTS

| | | | |
|---|---|---|---|
| JP | 2002-076571 A | | 3/2002 |
| JP | 2005-191156 A | | 7/2005 |
| JP | 2005191156 | * | 7/2005 |
| JP | 2006-186058 A | | 7/2006 |
| JP | 2010-141282 A | | 6/2010 |
| JP | 2011-029623 A | | 2/2011 |
| WO | 2011/132274 A1 | | 10/2011 |

OTHER PUBLICATIONS

Written Opinion issued in Application No. PCT/JP2013/067597 dated Aug. 13, 2013.
Office Action issued in corresponding Japanese Patent Application No. 2014-523694 dated Oct. 28, 2014.
Office Action issued in Chinese patent Application 201380027731 dated Sep. 5, 2016.

* cited by examiner

FIG. 1
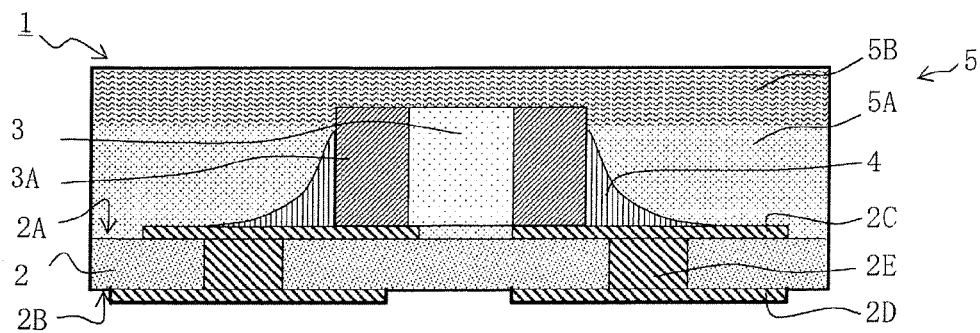
FIG. 2A
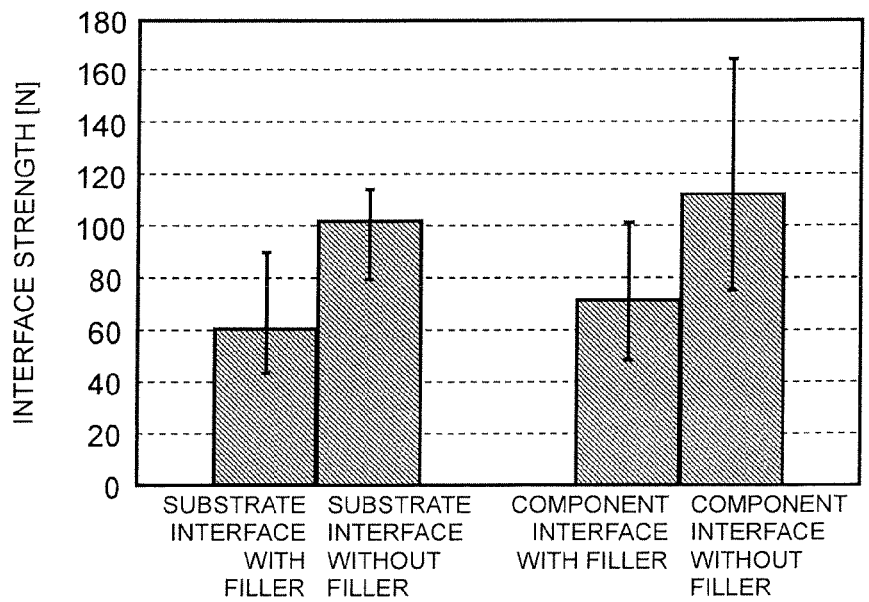
FIG. 2B
|  | FILLER ADDED | NO FILLER ADDED |
|---|---|---|
| MSL3 (30°C 60%RH 168hr) | 1/150 | 0/150 |
| MSL2a (30°C 60%RH 4weeks) | 3/150 | 0/150 |

COMPONENT-EMBEDDED SUBSTRATE

BACKGROUND OF THE INVENTION

Field of the Invention

The present invention relates to a component-embedded substrate in which an electronic component is embedded. In particular, the present invention relates to a component-embedded substrate in which an embedded electronic component is solder-mounted.

Description of the Related Art

For high-density mounting of electronic components, a component-embedded substrate in which electronic components are embedded is used. A component-embedded substrate is formed by solder-mounting electronic components on a printed wiring board (PWB), a ceramic board, a supporting plate, or the like, embedding the electronic components by lamination, dispensing, or injection molding of a thermosetting resin or the like, and curing the thermosetting resin.

The component-embedded substrate sometimes warps due to cure shrinkage of a resin layer during manufacture of the component-embedded substrate. To reduce cure shrinkage of the resin layer, an inorganic filler may be added to the thermosetting resin (see, for example, Patent Document 1).

FIG. 8 is a lateral cross-sectional view illustrating a configuration of a component-embedded substrate based on Patent Document 1.

A component-embedded substrate 101 includes wiring boards 110 and 120, passive electronic components 130, a semiconductor IC chip 131, a composite member 140, and a resin member 150. The wiring boards 110 and 120 are disposed opposite each other, with the composite member 140 and the resin member 150 interposed therebetween. The composite member 140 is made of a thermosetting resin containing an inorganic filler. The resin member 150 is disposed outside the composite member 140 and is made of a thermosetting resin containing no inorganic filler. The passive electronic components 130 are embedded in the composite member 140. The passive electronic components 130 are mounted to the wiring board 110 by being soldered to electrodes on the wiring board 110. The semiconductor IC chip 131 is mounted to the wiring board 120 by being soldered to electrodes on the outer surface of the wiring board 120.

In the component-embedded substrate 101, the composite member 140 in which the passive electronic components 130 are embedded contains an inorganic filler. This can reduce cure shrinkage of the thermosetting resin. When an individual module is cut out of a collection of modules combined together, cutting the composite member 140 containing an inorganic filler causes excessive wear of a cutting blade, such as a router blade. Cutting the resin member 150 containing no inorganic filler can reduce wear of the cutting blade.

Patent Document 1: Japanese Unexamined Patent Application Publication No. 2002-76571

BRIEF SUMMARY OF THE INVENTION

When the composite member 140 containing an inorganic filler is used, the adhesion at interfaces between the composite member 140 and the passive electronic components 130 and between the composite member 140 and the wiring boards 110 and 120 is lower than that in the case of using the composite member 140 containing no inorganic filler. This means that when the component-embedded substrate 101 is mounted on a circuit board of an electronic device by reflowing or the like, remelted solder for mounting the passive electronic components 130 may penetrate into the interfaces between the composite member 140 and the passive electronic components 130 and between the composite member 140 and the wiring boards 110 and 120, and a poor connection may occur. Also, the action of thermal hysteresis (heat cycle) makes the interfaces between the composite member 140 and the passive electronic components 130 and between the composite member 140 and the wiring boards 110 and 120 more susceptible to delamination.

An object of the present invention is to provide a component-embedded substrate in which even when an inorganic filler is used to reduce warpage of the substrate, it is still possible to reduce deterioration of adhesion at interfaces of the resin layer.

A component-embedded substrate according to the present invention includes a substrate portion, an embedded electronic component, and a resin portion. The substrate portion has an inner principal surface and inner electrodes on the inner principal surface. The embedded electronic component has terminal electrodes and is mounted to the substrate portion via solder fillets adhering to the respective terminal electrodes and the respective inner electrodes. The resin portion is stacked on the substrate portion, with the embedded electronic component embedded therein. The resin portion includes a no-filler-added layer and a filler-added layer. The no-filler-added layer contains no inorganic filler and extends from the inner principal surface to a height which allows at least the solder fillets to be covered. The filler-added layer contains an inorganic filler and extends from an interface with the no-filler-added layer to a height which allows at least the embedded electronic component to be covered.

The component-embedded substrate preferably further includes a second substrate portion and a second embedded electronic component. The second substrate portion is disposed opposite the substrate portion with the resin portion interposed therebetween. The second embedded electronic component is mounted to the second substrate portion while being embedded in the resin portion.

A component-embedded substrate according to the present invention includes a first substrate portion, a second substrate portion, a first embedded electronic component, a second embedded electronic component, and a resin portion. The first substrate portion and the second substrate portion each has an inner principal surface and inner electrodes on the inner principal surface. The first substrate portion and the second substrate portion are disposed such that the inner principal surfaces face each other. The first embedded electronic component has terminal electrodes, and is mounted to the first substrate portion via first solder fillets adhering to the respective terminal electrodes and the respective inner electrodes. The second embedded electronic component has terminal electrodes, and is mounted onto the inner electrodes on the second substrate portion via second solder fillets adhering to the respective terminal electrodes and the respective inner electrodes. The resin portion is stacked between the first substrate portion and the second substrate portion, with the first embedded electronic component and the second embedded electronic component embedded therein. The resin portion includes a first no-filler-added layer, a second no-filler-added layer, and a filler-added layer. The first no-filler-added layer contains no inorganic filler and extends from the inner principal surface of the first substrate portion to a height which allows at least the first solder fillets to be covered. The second no-filler-added layer contains no inorganic filler and extends from the inner principal surface of the second substrate portion to a height which allows at least the second solder fillets to be covered. The filler-added layer contains an inorganic filler and extends from an interface with the first no-filler-added layer to an interface with the second no-filler-added layer.

With the configurations described above, providing a filler-added layer can reduce warpage of the component-embedded substrate. Additionally, since a no-filler-added layer extends from the inner principal surface to a height which allows solder fillets to be covered, it is possible to enhance adhesion between the resin portion and the substrate portion and between the resin portion and the embedded electronic component.

The present invention can reduce warpage of the component-embedded substrate. Additionally, when the component-embedded substrate is mounted on a circuit board of an electronic device by reflowing or the like, the present invention can prevent remelted solder for mounting the embedded electronic component from penetrating into the interfaces between the resin portion and the embedded electronic component and between the resin portion and the substrate portion. The present invention can also prevent the action of thermal hysteresis (heat cycle) from causing delamination at the interfaces between the resin portion and the embedded electronic component and between the resin portion and the substrate portion.

BRIEF DESCRIPTION OF THE SEVERAL VIEWS OF THE DRAWINGS

FIG. 1 is a lateral cross-sectional view illustrating a configuration of a component-embedded substrate according to a first embodiment.

FIG. 2A shows interface strengths in the component-embedded substrate of the first embodiment, and FIG. 2B shows the number of faults.

DETAILED DESCRIPTION OF THE INVENTION

Figure 3A:
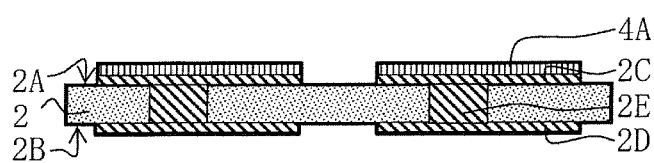
FIGS. 3A-3E are lateral cross-sectional views illustrating a method for manufacturing the component-embedded substrate according to the first embodiment.

Embodiments of the present invention will now be described with reference to FIGS. 1 to 7. In the drawings, conductive members are hatched with solid straight lines and insulating members are hatched with non-solid, non-straight lines.

<<First Embodiment>>

A configuration of a component-embedded substrate and a method for manufacturing the component-embedded substrate according to a first embodiment of the present invention will now be described.

FIG. 1 is a lateral cross-sectional view of a component-embedded substrate according to the first embodiment.

A component-embedded substrate 1 illustrated in FIG. 1 includes a substrate portion 2, an embedded electronic component 3, solder fillets 4, and a resin portion 5.

The component-embedded substrate 1 is formed by mounting the embedded electronic component 3 to the substrate portion 2, embedding the embedded electronic component 3 into the resin portion 5 in an uncured state, and curing the resin portion 5. Possible examples of the substrate portion 2 include a printed wiring board (PWB), a ceramic board, and a supporting plate. Possible examples of the embedded electronic component include a passive component, such as a capacitor, a coil, or a resistance chip, and an active component, such as an IC chip. A thermosetting resin or a photo-curable resin can be used to form the resin portion 5. The embedded electronic component 3 can be embedded in the resin portion 5, for example, by lamination, dispensing, or injection molding.

A more detailed configuration of the component-embedded substrate 1 will now be described. The substrate portion 2 is a PWB here, and has an inner principal surface 2A and an outer principal surface 2B opposite each other. The substrate portion 2 has two inner electrodes 2C on the inner principal surface 2A, two outer electrodes 2D on the outer principal surface 2B, and two via electrodes 2E inside. The two inner electrodes 2C are rectangular in plan view and are spaced apart from each other. The two outer electrodes 2D are rectangular in plan view and are spaced apart from each other. The two via electrodes 2E are each electrically continuous with the corresponding inner electrode 2C and the corresponding outer electrode 2D and are spaced apart from each other.

The embedded electronic component 3 is a passive component here, and has a rectangular parallelepiped outer shape. The embedded electronic component has two terminal electrodes 3A on the outer surface thereof. The two terminal electrodes 3A are disposed over the respective entire opposite end faces of the embedded electronic component 3 and each extends over regions in four side faces intersecting the corresponding end face, the regions having a given length from the end face. The two terminal electrodes 3A are spaced apart from each other.

The embedded electronic component 3 is mounted to the inner principal surface 2A of the substrate portion 2 by soldering the terminal electrodes 3A to the respective inner electrodes 2C. The two solder fillets 4 thus adhere to the respective terminal electrodes 3A and to the respective inner electrodes 2C. Each of the solder fillets 4 wets and spreads over both the inner electrode 2C and the terminal electrode 3A and is solidified, with most of its volume collected near the corner at which the inner electrode 2C and the terminal electrode 3A are adjacent to each other. A distance (attained height) reached by each solder fillet 4 in the direction away from the surface of the inner electrode 2C, the distance being relative to the surface of the inner electrode 2C, is smaller than the height of the embedded electronic component 3 relative to the surface of the inner electrode 2C.

The resin portion 5 is stacked on the inner principal surface 2A of the substrate portion 2, with the embedded electronic component 3 and the solder fillets 4 embedded therein. The resin portion 5 includes a no-filler-added layer 5A and a filler-added layer 5B. The no-filler-added layer 5A is made of a thermosetting resin containing no inorganic filler. The filler-added layer 5B is made of a material obtained by adding an inorganic filler to the same thermosetting resin as that used to form the no-filler-added layer 5A. The no-filler-added layer 5A and the filler-added layer 5B may be made of different types of thermosetting resins. It is preferable that the amount of inorganic filler contained in the filler-added layer 5B be adjusted in accordance with the warpage of the component-embedded substrate 1.

The no-filler-added layer 5A has a substantially uniform thickness from the inner principal surface 2A of the substrate portion 2 to a height which allows at least the inner electrodes 2C and the solder fillets 4 to be covered. The no-filler-added layer 5A penetrates into a space interposed between the two inner electrodes 2C which are between the embedded electronic component 3 and the substrate portion 2. As described above, the attained height of each solder fillet 4 relative to the surface of the inner electrode 2C is lower than the height of the embedded electronic component 3. Therefore, the no-filler-added layer 5A is provided to fully cover the inner electrodes 2C and the solder fillets 4, but to allow the embedded electronic component 3 to be partially exposed. That is, the no-filler-added layer 5A is provided on the inner principal surface 2A in a thickness that exceeds the attained height of the solder fillets 4, but does not exceed the height of the embedded electronic component 3.

The filler-added layer 5B has a substantially uniform thickness from the interface with the no-filler-added layer 5A to a height which allows at least the embedded electronic component 3 to be fully covered. Specifically, the filler-added layer 5B is formed to be thicker by a given amount than the height by which the embedded electronic component 3 protrudes from the no-filler-added layer 5A. Thus, the embedded electronic component 3 is embedded at a given depth or deeper from the surface of the filler-added layer 5B.

An adhesion test performed on a thermosetting resin containing no inorganic filler and a thermosetting resin containing an inorganic filler will now be described. FIG. 2A shows the interface strength at a substrate interface and the interface strength at a component interface obtained in the adhesion test for each of the thermosetting resins.

In the adhesion test, a load causing interface delamination (i.e., interface strength) was measured and the average and variation of interface strengths were determined for a plurality of samples obtained by applying a thermosetting resin containing no inorganic filler (i.e., a material equivalent to the no-filler-added layer 5A) to substrates or components and curing it, and a plurality of samples obtained by applying a thermosetting resin containing an inorganic filler (i.e., a material equivalent to the filler-added layer 5B) to substrates and components and curing it.

The adhesion test showed that for the material equivalent to the no-filler-added layer 5A, the average of interface strengths at the substrate interfaces was about 105 Newtons (N), whereas for the material equivalent to the filler-added layer 5B, the average of interface strengths at the substrate interfaces was about 61 Newtons (N). That is, in the case of using the thermosetting resin containing no inorganic filler, the interface strength at the interface with a PWB was about 170% higher than that in the case of using the thermosetting resin containing an inorganic filler.

The adhesion test also showed that for the material equivalent to the no-filler-added layer 5A, the average of interface strengths at the component interfaces was about 114 Newtons (N), whereas for the material equivalent to the filler-added layer 5B, the average of interface strengths at the component interfaces was about 72 Newtons (N). That is, in the case of using the thermosetting resin containing no inorganic filler, the interface strength at the interface with an electronic component was about 160% higher than that in the case of using the thermosetting resin containing an inorganic filler.

This result makes it possible to assume that in the component-embedded substrate 1 of the present embodiment, the level of adhesion between the no-filler-added layer 5A and the substrate portion 2 and the level of adhesion between the no-filler-added layer 5A and the embedded electronic component 3 are higher than the level of adhesion between the filler-added layer 5B and the substrate portion 2 and the level of adhesion between the filler-added layer 5B and the embedded electronic component 3. Therefore, when, as in the component-embedded substrate 1, the no-filler-added layer 5A is provided adjacent to the interface between the resin portion 5 and the substrate portion 2, it is possible to enhance adhesion between the resin portion 5 and the substrate portion 2 and between the resin portion 5 and the embedded electronic component 3, and it is very unlikely that the action of thermal hysteresis (heat cycle) will cause delamination at the interfaces between the resin portion 5 and the substrate portion 2 and between the resin portion 5 and the embedded electronic component 3.

Next, a fault test will now be described, which was performed on a component-embedded substrate including a resin portion formed by a no-filler-added layer and a filler-added layer and a component-embedded substrate including a resin portion formed only by a filler-added layer. FIG. 2B shows the number of faults obtained in the fault test.

As the fault test, a moisture sensitivity level (MSL) test was performed on a plurality of samples of the component-embedded substrate including a resin portion formed by a no-filler-added layer and a filler-added layer and a plurality of samples of the component-embedded substrate including a resin portion formed only by a filler-added layer. The MSL test is a test that measures moisture sensitivities of package components kept in a high humidity environment. This test measured the number of poor connections caused by penetration of remelted solder for mounting an electronic component into the interfaces between the resin portion and the electronic component and between the resin portion and the substrate portion.

First, a description will be given of the case where a reflow process with a maximum temperature of 260° C. was performed five times on the component-embedded substrates kept for 168 hours in an environment with a temperature of 30° C. and a humidity of 60% RH. In this case, no poor connection occurred in samples having a resin portion formed by a no-filler-added layer and a filler-added layer. However, a poor connection occurred in a sample having a resin portion formed only by a filler-added layer.

Next, a description will be given of the case where a reflow process with a maximum temperature of 260° C. was performed five times on the component-embedded substrates kept for a longer period of time, four weeks, in an environment with a temperature of 30° C. and a humidity of 60% RH. Again, no poor connection occurred in samples having a resin portion formed by a no-filler-added layer and a filler-added layer. In samples having a resin portion formed only by a filler-added layer, however, the number of poor connections was increased.

In the component-embedded substrate 1 of the present embodiment, as described above, the no-filler-added layer 5A is provided adjacent to the solder fillets 4. Therefore, even when the component-embedded substrate 1 is mounted on a circuit board of an electronic device by reflowing or the like, it is very unlikely that a poor connection will occur due to remelting and penetration of the solder fillets 4 into the interfaces between the resin portion 5 and the embedded electronic component 3 and between the resin portion 5 and the substrate portion 2.

In the present embodiment, the attained height of each solder fillet 4 relative to the surface of the corresponding inner electrode 2C is lower than the height of the embedded electronic component 3. Alternatively, the attained height of each solder fillet 4 relative to the surface of the corresponding inner electrode 2C may exceed the height of the embedded electronic component 3. In this case, the no-filler-added layer 5A preferably has a height which allows the inner electrodes 2C, the solder fillets 4, and the embedded electronic component 3 to be fully covered.

Although a thermosetting resin is used to form the no-filler-added layer 5A and the filler-added layer 5B in the present embodiment, a different resin material, such as a photo-curable resin, may be used to form the no-filler-added layer 5A and the filler-added layer 5B.

A method for manufacturing the component-embedded substrate 1 will now be described.

FIGS. 3A-3E are lateral cross-sectional views of the component-embedded substrate 1 in a manufacturing process. Generally, the component-embedded substrate 1 is manufactured by being cut out of a base board having a plurality of component-embedded substrates 1 integrally formed therein. FIGS. 3A-3E illustrate only a region of the base board where a single component-embedded substrate is formed.

In the manufacturing process of the component-embedded substrate 1, first, a solder-paste applying step illustrated in FIG. 3A is performed. In the solder-paste applying step, the substrate portion 2 formed by a PWB is prepared, and a solder paste 4A is applied to the inner electrodes 2C by printing. The solder paste 4A is applied to the surface of each of the two inner electrodes 2C in a uniform thickness.

Figure 3B:
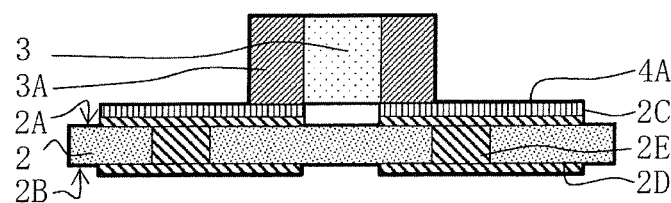

Next, an electronic-component positioning step illustrated in FIG. 3B is performed. In the electronic-component positioning step, the embedded electronic component 3 is positioned onto the two inner electrodes 2C and the solder paste 4A such that the terminal electrodes 3A on the embedded electronic component 3 are in contact with the solder paste 4A.

Figure 3C:
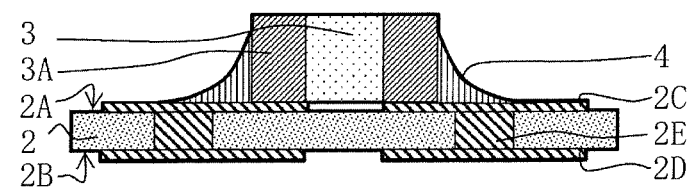

Next, a reflow step illustrated in FIG. 3C is performed. In the reflow step, the substrate portion 2 is heated in a reflow oven, so that the solder paste 4A melts, wets, and spreads over the terminal electrodes 3A and the inner electrodes 2C. Then, the substrate portion 2 is cooled, and the molten solder paste 4A is solidified to form the solder fillets 4. Thus, the embedded electronic component 3 is solder-mounted to the substrate portion 2.

Figure 3D:
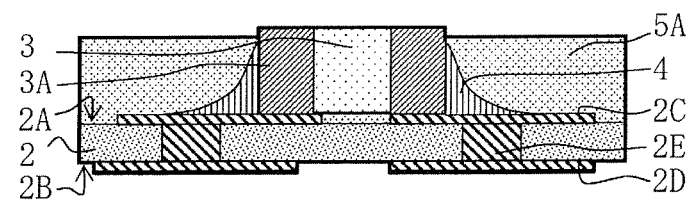

Next, a first resin-layer forming step illustrated in FIG. 3D is performed. In the first resin-layer forming step, a thermosetting resin paste containing no inorganic filler is applied to the inner principal surface 2A of the substrate portion 2 by a dispenser. The thermosetting resin paste is cured by being heated in the reflow oven or the like, and formed into the no-filler-added layer 5A of the resin portion 5. The thermosetting resin paste is applied in a thickness which allows the solder fillets 4 to be fully covered reliably even after cure shrinkage.

Figure 3E:
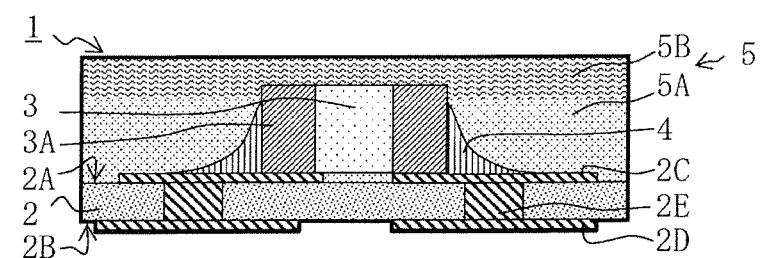

Next, a second resin-layer forming step illustrated in FIG. 3E is performed. In the second resin-layer forming step, a thermosetting resin paste containing an inorganic filler is applied to the surface of the no-filler-added layer 5A by a dispenser. The thermosetting resin paste is cured by being heated in the reflow oven or the like, and formed into the filler-added layer 5B of the resin portion 5. The thermosetting resin paste is applied in a thickness which allows the embedded electronic component 3 to be fully covered reliably even after cure shrinkage.

The component-embedded substrate 1 of the present embodiment can be manufactured by the manufacturing method described above. Although the thermosetting resin paste is thermally cured in the first resin-layer forming step to form the no-filler-added layer 5A, the thermosetting resin paste may not be cured in the first resin-layer forming step. Instead, the thermosetting resin pastes may be thermally cured in the second resin-layer forming step to form the no-filler-added layer 5A and the filler-added layer 5B at the same time.

Although a dispenser is used to apply a thermosetting resin paste in this example, a different technique, such as lamination or injection molding, may be used to provide the thermosetting resin paste. When a lamination technique is used to form the no-filler-added layer 5A, a molding sheet in a semi-cured state may be attached to the substrate portion 2. A dispenser or lamination technique may be used to apply a thermosetting resin paste to the substrate portion 2 to form the no-filler-added layer 5A, and an injection molding technique may be used only to form the filler-added layer 5B.

The design of concrete configurations of the component-embedded substrate 1 and details of each manufacturing step can be changed as necessary. The actions and effects described in the embodiments are merely listed as the actions and effects achieved by the present invention. The actions and effects of the present invention are not limited to the description of the embodiments.

<<Second Embodiment>>

A configuration of a component-embedded substrate and a method for manufacturing the component-embedded substrate according to a second embodiment of the present invention will now be described.

Figure 4:
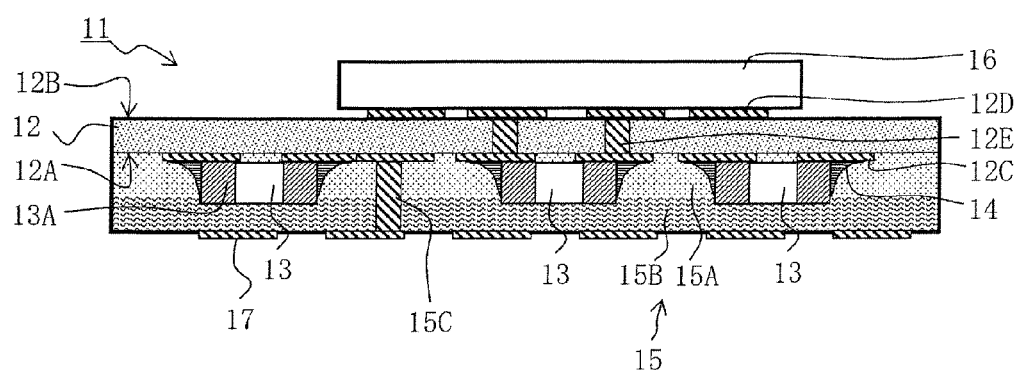
FIG. 4 is a lateral cross-sectional view illustrating a configuration of a component-embedded substrate according to a second embodiment.

FIG. 4 is a lateral cross-sectional view of a component-embedded substrate according to the second embodiment.

A component-embedded substrate 11 illustrated in FIG. 4 includes a substrate portion 12, embedded electronic components 13, solder fillets 14, a resin portion 15, an external electronic component 16, and external connection electrodes 17.

The substrate portion 12 has an inner principal surface 12A and an outer principal surface 12B. The substrate portion 12 has inner electrodes 12C on the inner principal surface 12A, outer electrodes 12D on the outer principal surface 12B, and via electrodes 12E inside.

The external electronic component 16 is flip-chip mounted on the outer electrodes 12D. The external electronic component 16 here is an IC chip (active element) used as a high-frequency module for communication. The embedded electronic components 13 are solder-mounted on the inner electrodes 12C. The embedded electronic components 13 each has terminal electrodes 13A on the outer surface thereof. The solder fillets 14 adhere to the respective terminal electrodes 13A on each embedded electronic component 13 and to the respective inner electrodes 12C on the substrate portion 12.

The resin portion 15 includes a no-filler-added layer 15A and a filler-added layer 15B. The no-filler-added layer 15A is stacked on the inner principal surface 12A of the substrate portion 12 to fully cover the solder fillets 14, but to allow the embedded electronic components 13 to be partially exposed.

The filler-added layer 15B is stacked on the surface of the no-filler-added layer 15A. The filler-added layer 15B is formed to be thicker by a given amount than the height by which the embedded electronic components 13 protrude from the no-filler-added layer 15A.

The external connection electrodes 17 are disposed on the outer surface of the resin portion 15 opposite the inner principal surface 12A. The resin portion 15 has a via electrode 15C passing through the no-filler-added layer 15A and the filler-added layer 15B. The via electrode 15C is electrically continuous with the corresponding inner electrode 12C on the substrate portion 12 and with the corresponding external connection electrode 17.

In the component-embedded substrate 11 of the present embodiment, the no-filler-added layer 15A is provided adjacent to the interface between the substrate portion 12 and the resin portion 15. This enhances adhesion between the resin portion 15 and the substrate portion 12 and between the resin portion 15 and the embedded electronic components 13, and makes it very unlikely that the action of thermal hysteresis (heat cycle) will cause delamination at the interfaces between the resin portion 15 and the substrate portion 12 and between the resin portion 15 and the embedded electronic components 13. Also, even when the component-embedded substrate 11 is mounted on a circuit board of an electronic device by reflowing or the like, it is very unlikely that a poor connection will occur due to remelting and penetration of the solder fillets 14 into the interfaces between the resin portion 15 and the substrate portion 12 and between the resin portion 15 and the embedded electronic components 13.

A method for manufacturing the component-embedded substrate 11 will now be described.

FIGS. 5A-5E are lateral cross-sectional views of the component-embedded substrate 11 in a manufacturing process.

Figure 5A:
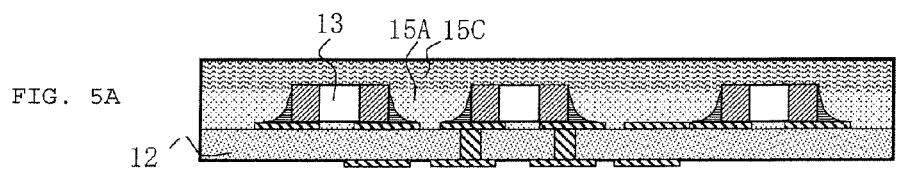
FIGS. 5A-5E are lateral cross-sectional views illustrating a method for manufacturing the component-embedded substrate according to the second embodiment.

In the manufacturing process of the component-embedded substrate 11, first, a multilayer-body forming step illustrated in FIG. 5A is performed. In the multilayer-body forming step, in a procedure similar to that illustrated in FIGS. 3A-3E in the first embodiment, the embedded electronic components 13 are solder-mounted to the substrate portion 12, the no-filler-added layer 15A is formed with the embedded electronic components 13 embedded therein, and a thermosetting resin paste 15C containing an inorganic filler is applied to the surface of the no-filler-added layer 15A.

Figure 5B:
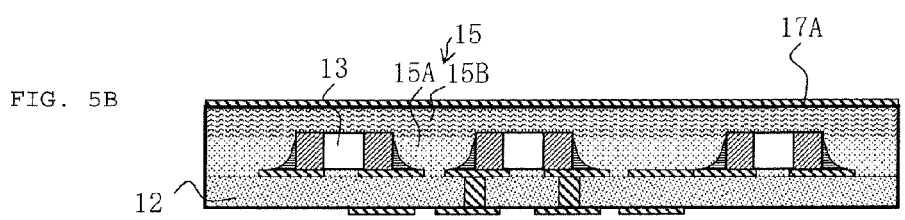

Next, an electrode-film forming step illustrated in FIG. 5B is performed. In the electrode-film forming step, copper foil 17A is attached to the surface of the paste 15C in an uncured state. The paste 15C is cured by being heated in a reflow oven or the like, and formed into the filler-added layer 15B of the resin portion 15.

Figure 5C:
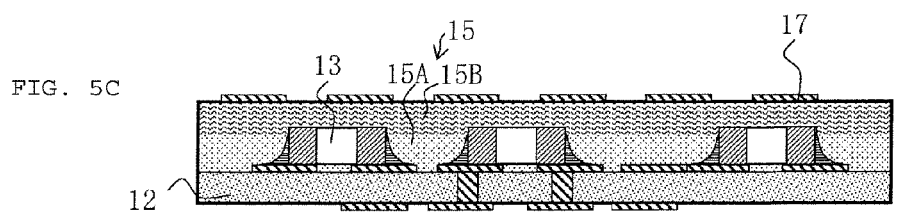

Next, an electrode patterning step illustrated in FIG. 5C is performed. In the electrode patterning step, the copper foil 17A is patterned by a subtractive technique to form the external connection electrodes 17.

Figure 5D:
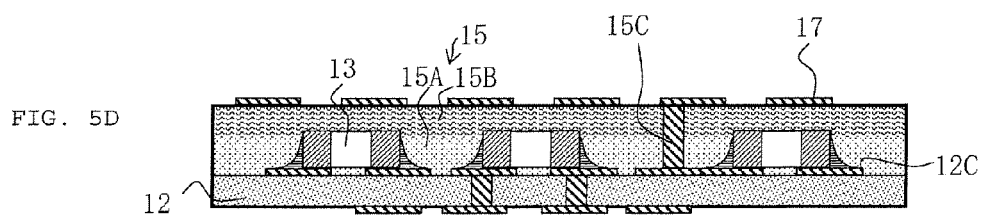

Next, a via-electrode forming step illustrated in FIG. 5D is performed. In the via-electrode forming step, a via hole reaching the corresponding inner electrode 12C is formed in the resin portion 15 with $CO_2$ laser. The via hole is filled with a paste mainly composed of Cu or Sn by vacuum printing, and the paste is hardened. Then, a resist is formed on the external connection electrodes 17, and Ni plating and Au plating are applied to a conductor-exposed portion in the via hole. The via electrode 15C is thus obtained.

Figure 5E:
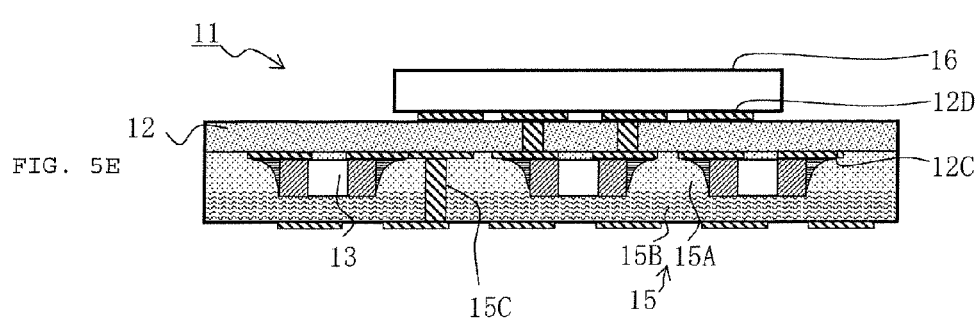

Next, an external-electronic-component mounting step illustrated in FIG. 5E is performed. In the external-electronic-component mounting step, the external electronic component 16 is flip-chip mounted to the outer electrodes 12D on the substrate portion 12.

The component-embedded substrate 11 of the present embodiment can be manufactured by the steps described above.

<<Third Embodiment>>

A configuration of a component-embedded substrate according to a third embodiment of the present invention will now be described.

Figure 6:
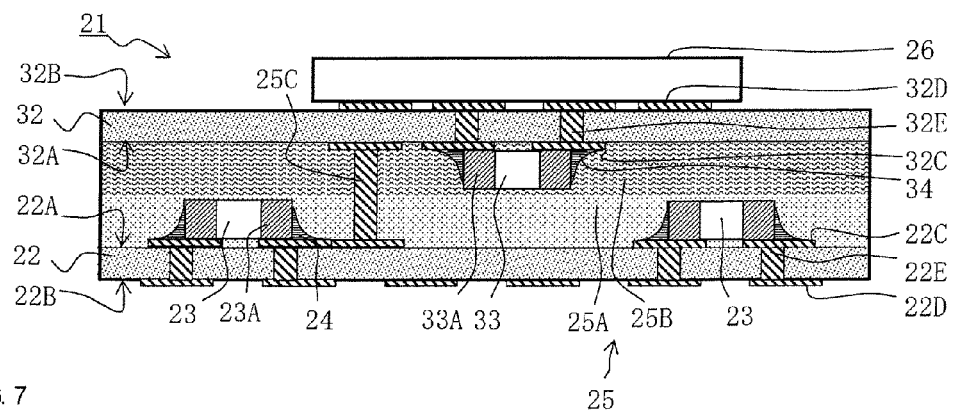
FIG. 6 is a lateral cross-sectional view illustrating a configuration of a component-embedded substrate according to a third embodiment.

FIG. 6 is a lateral cross-sectional view of a component-embedded substrate according to the third embodiment.

A component-embedded substrate 21 illustrated in FIG. 6 includes a first substrate portion 22, a second substrate portion 32, first embedded electronic components 23, a second embedded electronic component 33, first solder fillets 24, second solder fillets 34, a resin portion 25, and an external electronic component 26.

The substrate portion 22 has an inner principal surface 22A and an outer principal surface 22B. The substrate portion 22 has inner electrodes 22C on the inner principal surface 22A, outer electrodes 22D on the outer principal surface 22B, and via electrodes 22E inside.

The substrate portion 32 has an inner principal surface 32A and an outer principal surface 32B. The substrate portion 32 is disposed opposite the substrate portion 22, with the inner principal surface 32A facing the inner principal surface 22A of the substrate portion 22. The substrate portion 32 has inner electrodes 32C on the inner principal surface 32A, outer electrodes 32D on the outer principal surface 32B, and via electrodes 32E inside.

The external electronic component 26 is solder-mounted onto the outer electrodes 32D on the substrate portion 32. The embedded electronic components 23 are solder-mounted onto the inner electrodes 22C on the substrate portion 22. The embedded electronic component 33 is solder-mounted onto the inner electrodes 32C on the substrate portion 32. The embedded electronic components 23 each has terminal electrodes 23A on the outer surface thereof, and the embedded electronic component 33 has terminal electrodes 33A on the outer surface thereof. The solder fillets 24 adhere to the respective terminal electrodes 23A on each embedded electronic component 23 and to the respective inner electrodes 22C on the substrate portion 22. The solder fillets 34 adhere to the respective terminal electrodes 33A on the embedded electronic component 33 and to the respective inner electrodes 32C on the substrate portion 32.

The resin portion 25 includes a no-filler-added layer 25A and a filler-added layer 25B. The no-filler-added layer 25A is provided on the inner principal surface 22A of the substrate portion 22 in a thickness which allows the inner electrodes 22C, the solder fillets 24, and the embedded electronic components 23 to be covered. The filler-added layer 25B is provided on the inner principal surface 32A of the substrate portion 32 in a thickness which allows the inner electrodes 32C, the solder fillets 34, and the embedded electronic component 33 to be covered and reaches the surface of the no-filler-added layer 25A.

The resin portion 25 has a via electrode 25C passing through the no-filler-added layer 25A and the filler-added layer 25B. The via electrode 25C is electrically continuous with the corresponding inner electrode 22C on the substrate portion 22 and with the corresponding inner electrode 32C on the substrate portion 32. The outer electrodes 22D on the substrate portion 22 are used as external connection electrodes.

The component-embedded substrate 21 of the present embodiment allows high-density mounting of more embedded electronic components than the component-embedded substrates 1 and 11 of the first and second embodiments.

In the component-embedded substrate 21, the filler-added layer 25B, instead of the no-filler-added layer 25A, is provided adjacent to the interface between the substrate portion 32 and the resin portion 25. This may cause delamination at the interface between the resin portion 25 and the substrate portion 32, or a poor connection resulting from remelting and penetration of the solder fillets 34 into the interfaces between the resin portion 25 and the embedded electronic component 33 and between the resin portion 25 and the substrate portion 32. However, since the no-filler-added layer 25A is provided adjacent to the interface between the substrate portion 22 and the resin portion 25, it is very unlikely that at least delamination will occur at the interface between the resin portion 25 and the substrate portion 22. Also, even when the component-embedded substrate 21 is mounted on a circuit board of an electronic device by reflowing or the like, it is very unlikely that a poor connection will occur due to remelting and penetration of the solder fillets 24 into the interfaces between the resin portion 25 and the embedded electronic components 23 and between the resin portion 25 and the substrate portion 22.

The component-embedded substrate 21 can be manufactured by bonding together a member including the substrate portion 22 and a member including the substrate portion 32. For example, the component-embedded substrate 21 may be manufactured by preparing a member including the substrate portion 22 and the no-filler-added layer 25A combined together and a member including the substrate portion 32 and the filler-added layer 25B combined together, and bonding these members together with a conductive adhesive or the like. Alternatively, the component-embedded substrate 21 may be manufactured by bonding together a member including the substrate portion 22 and a member including the substrate portion 32 while the no-filler-added layer 25A and the filler-added layer 25B are in an uncured state, curing the no-filler-added layer 25A and the filler-added layer 25B, and then forming the via electrode 25C.

Although the no-filler-added layer 25A is provided adjacent to the substrate portion 22 in the present embodiment, the no-filler-added layer 25A may be provided adjacent to the substrate portion 32 and the filler-added layer 25B may be provided adjacent to the substrate portion 22.

<<Fourth Embodiment>>

A configuration of a component-embedded substrate according to a fourth embodiment of the present invention will now be described.

Figure 7:
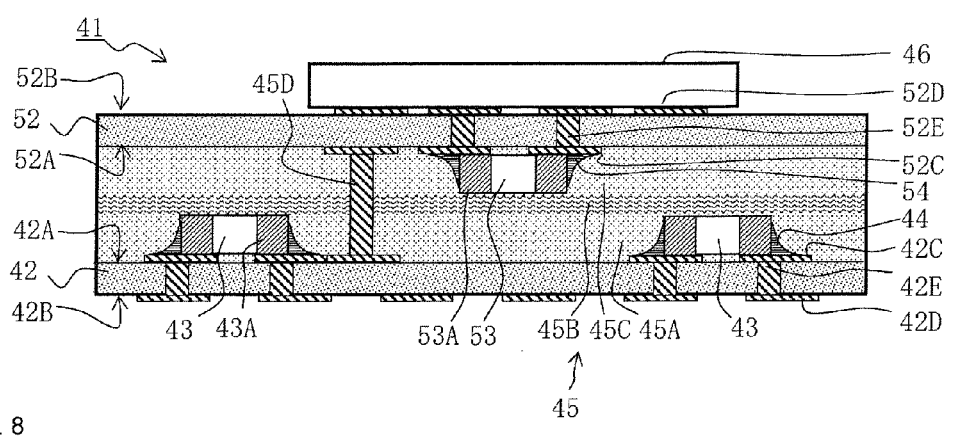
FIG. 7 is a lateral cross-sectional view illustrating a configuration of a component-embedded substrate according to a fourth embodiment.
Figure 8:
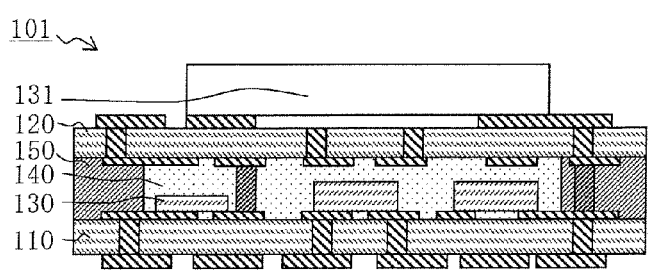
FIG. 8 is a lateral cross-sectional view illustrating a configuration of a conventional component-embedded substrate.

FIG. 7 is a lateral cross-sectional view of a component-embedded substrate according to the fourth embodiment.

A component-embedded substrate 41 illustrated in FIG. 7 includes a first substrate portion 42, a second substrate portion 52, first embedded electronic components 43, a second embedded electronic component 53, first solder fillets 44, second solder fillets 54, a resin portion 45, and an external electronic component 46.

The substrate portion 42 has an inner principal surface 42A and an outer principal surface 42B. The substrate portion 42 has inner electrodes 42C on the inner principal surface 42A, outer electrodes 42D on the outer principal surface 42B, and via electrodes 42E inside.

The substrate portion 52 has an inner principal surface 52A and an outer principal surface 52B. The substrate portion 52 is disposed opposite the substrate portion 42, with the inner principal surface 52A facing the inner principal surface 42A of the substrate portion 42. The substrate portion 52 has inner electrodes 52C on the inner principal surface 52A, outer electrodes 52D on the outer principal surface 52B, and via electrodes 52E inside.

The external electronic component 46 is solder-mounted onto the outer electrodes 52D on the substrate portion 52. The embedded electronic components 43 are solder-mounted onto the inner electrodes 42C on the substrate portion 42. The embedded electronic component 53 is solder-mounted onto the inner electrodes 52C on the substrate portion 52. The embedded electronic components 43 each has terminal electrodes 43A on the outer surface thereof, and the embedded electronic component 53 has terminal electrodes 53A on the outer surface thereof. The solder fillets 44 adhere to the respective terminal electrodes 43A on each embedded electronic component 43 and to the respective inner electrodes 42C on the substrate portion 42. The solder fillets 54 adhere to the respective terminal electrodes 53A on the embedded electronic component 53 and to the respective inner electrodes 52C on the substrate portion 52.

The resin portion 45 includes a first no-filler-added layer 45A, a filler-added layer 45B, and a second no-filler-added layer 45C. The no-filler-added layer 45A is provided on the inner principal surface 42A of the substrate portion 42 in a thickness which allows the inner electrodes 42C, the solder fillets 44, and the embedded electronic components 43 to be covered. The no-filler-added layer 45C is provided on the inner principal surface 52A of the substrate portion 52 in a thickness which allows the inner electrodes 52C, the solder fillets 54, and the embedded electronic component 53 to be covered. The filler-added layer 45B is provided between the no-filler-added layer 45A and the no-filler-added layer 45C.

The resin portion 45 has a via electrode 45D passing through the no-filler-added layers 45A and 45C and the filler-added layer 45B. The via electrode 45D is electrically continuous with the corresponding inner electrode 42C on the substrate portion 42 and with the corresponding inner electrode 52C on the substrate portion 52. The outer electrodes 42D on the substrate portion 42 are used as external connection electrodes.

The component-embedded substrate 41 of the present embodiment allows high-density mounting of more embedded electronic components than the component-embedded substrates 1 and 11 of the first and second embodiments.

In the component-embedded substrate 41, not only the no-filler-added layer 45A is provided adjacent to the interface between the substrate portion 42 and the resin portion 45, but also the no-filler-added layer 45C is provided adjacent to the interface between the substrate portion 52 and the resin portion 45. This not only enhances adhesion between the resin portion 45 and the substrate portion 42 and between the resin portion 45 and the embedded electronic components 43, but also enhances adhesion between the resin portion 45 and the substrate portion 52 and between the resin portion 45 and the embedded electronic component 53. Therefore, it is very unlikely that delamination will occur at the interfaces between the resin portion 45 and the substrate portions 42 and 52. Also, even when the component-embedded substrate 41 is mounted on a circuit board of an electronic device by reflowing or the like, it is very unlikely that a poor connection will occur due to remelting and penetration of the solder fillets 44 and 54 into the interfaces between the resin portion 45 and the embedded electronic components 43 and 53 and between the resin portion 45 and the substrate portions 42 and 52.

The no-filler-added layers 45A and 45C may have a thickness which allows the corresponding parts of the embedded electronic components 43 and 53 to protrude. The component-embedded substrate 41 can be manufactured by bonding together a member including the substrate portion 42 and a member including the substrate portion 52. For example, the component-embedded substrate 41 may be manufactured by preparing a member including the substrate portion 42 and a member including the substrate portion 52 and bonding these members together with a conductive adhesive or the like. Alternatively, the component-embedded substrate 41 may be manufactured by bonding together a member including the substrate portion 42 and a member including the substrate portion 52 while the filler-added layer 45B is in an uncured state, curing the filler-added layer 45B, and then forming the via electrode 45D.

REFERENCE SIGNS LIST 1, 11, 21, 41: component-embedded substrate
2, 12, 22, 32, 42, 52: substrate portion
2A, 12A, 22A, 32A, 42A, 52A: inner principal surface
2B, 12B, 22B, 32B, 42B, 52B: outer principal surface
2C, 12C, 22C, 32C, 42C, 52C: inner electrode
2D, 12D, 22D, 32D, 42D, 52D: outer electrode
2E, 12E, 22E, 32E, 42E, 52E, 15C, 25C, 45D: via electrode
3, 13, 23, 33, 43, 53: embedded electronic component
3A, 13A, 23A, 33A, 43A, 53A: terminal electrode
4, 14, 24, 34, 44, 54: solder fillet
4A: solder paste
5, 15, 25, 45: resin portion
5A, 15A, 25A, 45A, 45C: no-filler-added layer
5B, 15B, 25B, 45B: filler-added layer
16, 26, 46: external electronic component
17: external connection electrode
17A: copper foil

The invention claimed is:

1. A component-embedded substrate comprising:
a substrate portion having an inner principal surface and inner electrodes on the inner principal surface;
an embedded electronic component having terminal electrodes and mounted to the substrate portion via solder fillets adhering to the respective terminal electrodes and the respective inner electrodes; and
a resin portion stacked on the substrate portion, with the embedded electronic component embedded therein,
wherein the resin portion includes
a no-filler-added layer containing no inorganic filler arranged above an entire extent of the inner principal surface of the substrate portion, and extending from the inner principal surface to a height which allows at least the solder fillets to be covered; and
a filler-added layer containing an inorganic filler and extending from an interface with the no-filler-added layer to a height which allows at least the embedded electronic component to be covered,
wherein the filler-added layer covers an entire portion of a top surface of the embedded electronic component, and the no-filler-added layer does not reach the top surface of the embedded electronic component.

2. The component-embedded substrate according to claim 1, further comprising:
a second substrate portion disposed opposite the substrate portion with the resin portion interposed therebetween; and
a second embedded electronic component mounted to the second substrate portion while being embedded in the resin portion.

3. The component-embedded substrate according to claim 1, wherein the substrate portion comprises a printed wiring board, a ceramic board, or a supporting plate.

4. The component-embedded substrate according to claim 1, wherein the embedded electronic component is a passive component comprises a capacitor, a coil, or a resistance chip or the embedded electronic component is an active component comprising an IC chip.

5. The component-embedded substrate according to claim 1, wherein the resin portion comprises a thermosetting resin or a photo-curable resin.

6. A component-embedded substrate comprising:
a first substrate portion and a second substrate portion each having an inner principal surface and inner electrodes on the inner principal surface, the first substrate portion and the second substrate portion being disposed such that the inner principal surfaces face each other;
a first embedded electronic component having terminal electrodes and mounted to the first substrate portion via first solder fillets adhering to the respective terminal electrodes and the respective inner electrodes;
a second embedded electronic component having terminal electrodes and mounted to the second substrate portion via second solder fillets adhering to the respective terminal electrodes and the respective inner electrodes; and
a resin portion stacked between the substrate portions, with the first embedded electronic component and the second embedded electronic component embedded therein,
wherein the resin portion includes
a first no-filler-added layer containing no inorganic filler arranged above an entire extent of the inner principal surface of the first substrate portion, and extending from the inner principal surface of the first substrate portion to a height which allows at least the first solder fillets to be covered;
a second no-filler-added layer containing no inorganic filler arranged above an entire extent of the inner principal surface of the second substrate portion, and extending from the inner principal surface of the second substrate portion to a height which allows at least the second solder fillets to be covered; and
a filler-added layer containing an inorganic filler and extending from an interface with the first no-filler-added layer to an interface with the second no-filler-added layer,
wherein the filler-added layer covers an entire portion of a top surface of the embedded electronic component, and the first no-filler-added layer does not reach the top surface of the embedded electronic component.

* * * * *